(12) United States Patent
Krone

(10) Patent No.: US 7,986,929 B2
(45) Date of Patent: Jul. 26, 2011

(54) PROVIDING CHANNEL FILTERING IN AN AUTOMATIC FREQUENCY CONTROL PATH

(75) Inventor: Andrew W. Krone, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1200 days.

(21) Appl. No.: 11/636,021

(22) Filed: Dec. 8, 2006

(65) Prior Publication Data

US 2008/0139148 A1 Jun. 12, 2008

(51) Int. Cl.
*H04B 1/18* (2006.01)

(52) U.S. Cl. .................. 455/192.2; 455/260; 455/334

(58) Field of Classification Search ............... 455/192.1, 455/192.2, 205, 210, 213, 255–260, 323, 455/334

See application file for complete search history.

(56) References Cited

U.S. PATENT DOCUMENTS

| | | | |
|---|---|---|---|
| 5,012,244 A | 4/1991 | Wellard et al. | |
| 5,055,846 A | 10/1991 | Welland | |
| 5,243,345 A | 9/1993 | Naus et al. | |
| 5,248,972 A | 9/1993 | Karema et al. | |
| 5,373,247 A * | 12/1994 | Furukawa et al. | ............ 329/306 |
| 5,719,573 A | 2/1998 | Leung et al. | |
| 5,736,950 A | 4/1998 | Harris et al. | |
| 5,742,246 A | 4/1998 | Kuo et al. | |
| 6,005,506 A | 12/1999 | Bazarjani et al. | |
| 6,061,009 A | 5/2000 | Krone et al. | |
| 6,516,185 B1 | 2/2003 | MacNally | |
| 6,590,943 B1 | 7/2003 | Ali | |
| 6,646,581 B1 | 11/2003 | Huang | |
| 6,654,594 B1 | 11/2003 | Hughes et al. | |
| 6,888,484 B2 | 5/2005 | Kiss et al. | |
| 7,151,917 B2 | 12/2006 | Paulus | |
| 7,321,324 B2 | 1/2008 | Piovaccari et al. | |
| 2003/0174641 A1 | 9/2003 | Rahman | |
| 2003/0199257 A1 * | 10/2003 | Wilkinson et al. | ......... 455/127.1 |
| 2003/0235258 A1 * | 12/2003 | Kenney et al. | ................ 375/344 |
| 2006/0227907 A1 * | 10/2006 | Lim | ............................... 375/345 |
| 2007/0001881 A1 * | 1/2007 | Piovaccari | .................... 341/143 |

OTHER PUBLICATIONS

Silicon Labs, "Si4730/31 Broadcast AM/FM Radio Receiver," Feb. 14, 2007, pp. 1-2.
U.S. Appl. No. 11/635,973, filed Dec. 8, 2006, entitled "Reducing Noise During a Gain Change," by Andrew W. Krone.
W. Redman-White, et al., "Integrated Fourth-Order Convertor with Stable Self-Tuning Continuous-Time Noise Shaper," Jun. 1, 1994, pp. 145-150.
"A Third-Order Sigma-Delta Modulator for Dual-Mode Receivers" Rusu, A. and Tenhunen, H. Proceedings of the 46th IEEE International Midwest Symposium on Circuits and Systems, 2003. (MWSCAS '03). vol. 1, pp. 68-71. Published Dec. 27-30, 2003.
PCT/US2006/025308 International Search Report with Written Opinion of the International Searching Authority, mailed Nov. 7, 2006 in U.S. Appl. No. 11/270,908.
U.S. Patent and Trademark Office, First Office Action Mailed Sep. 5, 2006 with Reply to Office Action filed on Nov. 29, 2006 in U.S. Appl. No. 11/270,908.

(Continued)

*Primary Examiner* — Nhan Le
(74) *Attorney, Agent, or Firm* — Trop, Pruner & Hu, P.C.

(57) ABSTRACT

In one embodiment, the present invention includes a method for filtering an incoming signal in a channel filter of an automatic frequency control (AFC) loop to obtain a filtered incoming signal, generating a frequency offset from the filtered incoming signal in the AFC loop, removing the frequency offset from the incoming signal to obtain an adjusted signal, and providing the adjusted signal to an input of the channel filter.

14 Claims, 9 Drawing Sheets

OTHER PUBLICATIONS

U.S. Patent and Trademark Office, Final Office Action Mailed Jan. 5, 2007 with Reply to Final Office Action filed on Feb. 28, 2007 in U.S. Appl. No. 11/270,908.

U.S. Patent and Trademark Office, Notice of Allowance Mailed Apr. 2, 2007 with 312 Amendment and Issue Fee filed on Jun. 27, 2007 in U.S. Appl. No. 11/270,908.

* cited by examiner ic # PROVIDING CHANNEL FILTERING IN AN AUTOMATIC FREQUENCY CONTROL PATH

FIELD OF THE INVENTION

Embodiments of the present invention relate to radios, and more particularly to such radios including an amplitude modulation (AM) receiver.

BACKGROUND

Radio receivers such as AM and frequency modulation (FM) receivers are well known and are pervasive. Conventionally, these receivers have been formed of analog circuitry to receive an incoming radio frequency (RF) signal, downconvert the signal, and demodulate the downconverted signal to obtain an audio signal for output. Typically, the circuitry for AM and FM receivers, even in a combined radio, includes separate dedicated paths for AM and FM operation. While such analog-based circuitry may perform well, the area associated with this analog circuitry typically exceeds that used for digital circuitry, and the analog receivers typically include many discrete components. In contrast, digital circuitry is generally available in ever-decreasing sizes, as the benefits of advanced semiconductor processes provide for greater integration. Furthermore, the cost of digital integrated circuits (ICs) is generally less than corresponding analog circuitry.

Accordingly, some radio receivers are being designed to incorporate greater amounts of digital circuitry. While such circuitry may improve performance and can be formed in small packages, typically there are complexities in processing RF signals that require significant digital processing to match the relatively simple circuitry of an analog receiver.

Radio receivers include various components including circuitry for locking the receiver onto a desired channel. Such circuitry often includes automatic frequency control (AFC) circuitry to track a carrier frequency of the desired channel of an incoming signal. Furthermore, because the radio spectrum is relatively crowded, in addition to a desired channel, one or more adjacent channels may be relatively close in frequency to the desired channel. As such, receivers typically include a channel filter which may be in the form of a bandpass filter to remove unwanted channels and pass a desired channel. However, some amount of undesired channel information can still be present in the channel filter output.

Circuitry for AFC as well as channel filtering can be located in various places in a signal processing path of a receiver. In some receivers, the channel filter may be placed in front of the AFC circuitry, while in other receivers the AFC circuitry may come before the channel filter. In either instance, undesired effects can occur. If the channel filter is placed ahead of the AFC circuitry within a signal processing path, the incoming signal may not be frequency centered within the channel filter, causing frequency response distortion. If instead the AFC circuitry is placed in front of the filter within the signal processing path, one or more non-desired channels may influence the AFC circuitry and cause noise or distortion.

SUMMARY OF THE INVENTION

In one aspect, the present invention is directed to an apparatus that includes a channel filter to filter an incoming signal and to output a channel filtered signal and an automatic frequency control (AFC) loop including the channel filter to frequency lock the incoming signal to a desired frequency. The AFC loop may further act to phase lock the incoming signal. In one embodiment, the AFC loop may be formed of two separate loops, including a first loop having a filter to low pass filter a phase information signal and a second loop having a second filter to substantially all pass the phase information signal.

Another aspect of the present invention includes a method for filtering an incoming signal in a channel filter of an AFC loop to obtain a filtered incoming signal, generating a frequency offset from the filtered incoming signal in the AFC loop, removing the frequency offset to obtain an adjusted signal, and providing the adjusted signal to an input of the channel filter. Still further, a phase offset may be generated from the filtered incoming signal, which also may be removed from the incoming signal.

In yet another implementation, a radio receiver may include a signal path to receive and downconvert an incoming AM signal to a baseband signal, a first feedback loop coupled between an output node and a first combiner of the signal path to remove a frequency offset from the baseband signal, and a second feedback loop coupled between the output node and a second combiner of the signal path. In this implementation, the second combiner may be downstream of the first combiner and the second feedback loop is used to remove a phase offset from the baseband signal. The radio receiver may further include a channel filter coupled between the first and second combiners.

While embodiments may be implemented in many different forms, in one embodiment an apparatus may take the form of an integrated circuit (IC) including a radio receiver such as described above. The IC may be configured in a system as a receiver to receive an AM signal, where the receiver includes a first combiner to receive a digitized representation of the received AM signal and a frequency offset value in a first direction, a channel filter to filter an output of the first combiner to pass a selected channel signal, a second combiner to combine the selected channel signal and the frequency offset value in a second direction opposite to the first direction, a demodulator to demodulate an output of the second combiner, and an output device to output the demodulated signal.

DETAILED DESCRIPTION

In various embodiments, a channel filter may be located within AFC circuitry of a receiver, and more particularly within an AFC loop of the receiver. In this way, channel filtering may be combined with the AFC function, achieving a signal centered within the channel filter and a corresponding reduction in undesired channel(s) that may negatively impact AFC operation, thus improving both noise and other distortion effects.

While the scope of the present invention is not limited in this regard, in some implementations a combined channel filter/AFC loop may be implemented in hardware. However, other implementations may be performed using at least some amounts of software and/or firmware. That is, in some implementations a digital signal processor (DSP) or other programmable processing unit may perform at least portions of the channel filtering and AFC functions. Furthermore, different implementations may exist to further improve performance by providing multiple feedback paths or loops to remove both frequency and phase offsets of an incoming AM signal. In some implementations offset frequency filtering may be performed to further aid in reducing the effect of interference from one or more adjacent channels having significant power.

Figure 1:
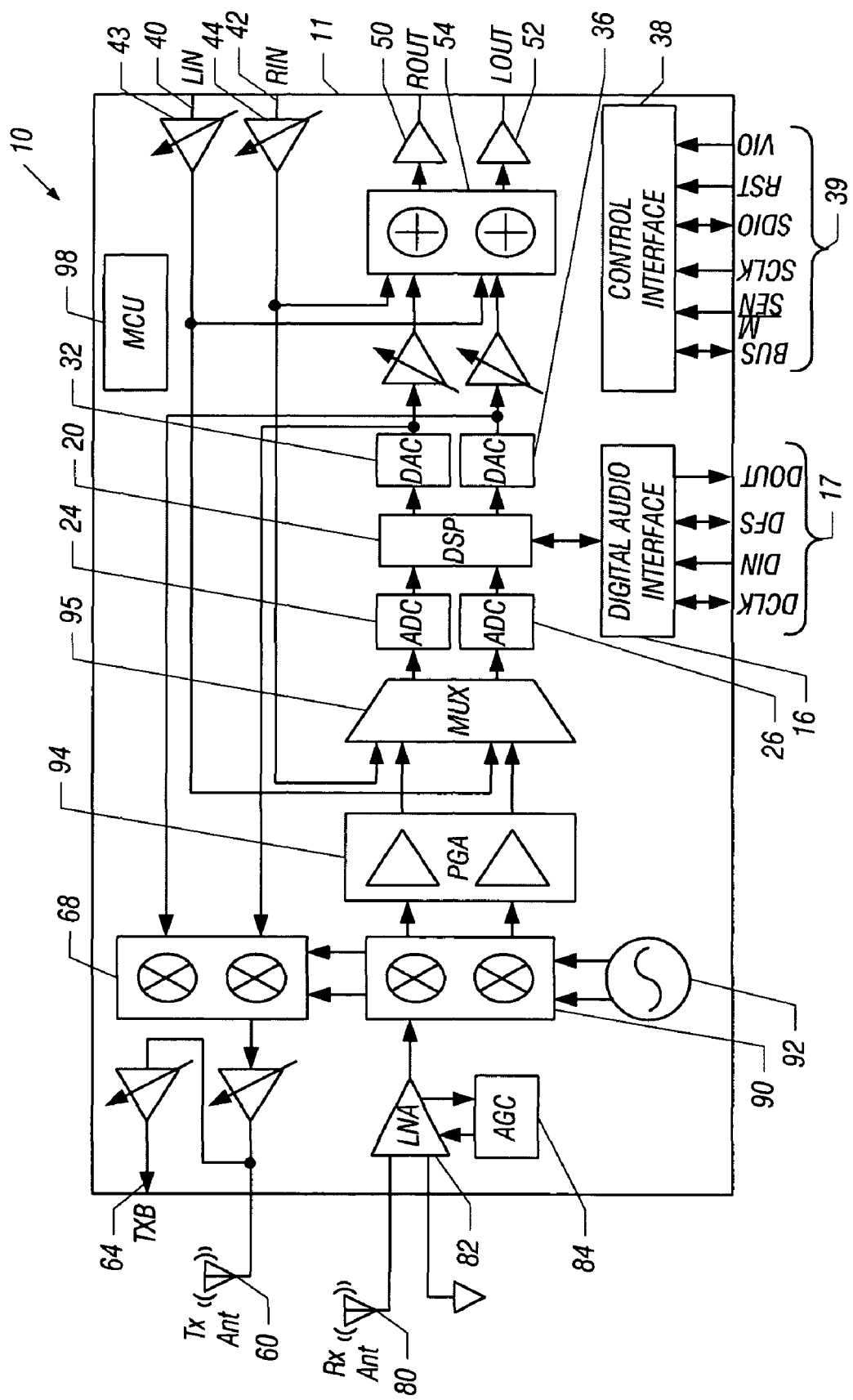
FIG. 1 is a block diagram of a multimode combined AM/frequency modulation (FM) transceiver.

Referring now to FIG. 1, in accordance with embodiments of the invention described herein, a multimode combined AM/frequency modulation (FM) transceiver 10, which may be fabricated on a monolithic semiconductor die 11, has several different signal processing modes of operations, in which the transceiver 10 may perform FM transmission, AM or FM reception, analog mixing, digital mixing and codec functions. More specifically, as described herein, the multimode FM transceiver 10 has an FM transmit mode in which the transceiver 10 functions as an FM transmitter; an AM or FM receive mode in which the transceiver 10 functions as a receiver; and an audio mode in which the transceiver 10 functions as a codec. In each of these modes of operation, the multimode transceiver 10 may perform various analog and/or digital mixing functions. Additionally, in accordance with some embodiments of the invention, the multimode transceiver 10 includes a digital audio interface 16, which allows the communication of digital audio signals between the transceiver 10 and circuitry ("off-chip" circuitry, for example) that is external to the transceiver 10.

In accordance with embodiments of the invention the FM transmit, AM and FM receive and audio modes are orthogonal in that the multimode transceiver 10 is in only one of the modes at a time. However, it is understood that in other embodiments of the invention, the multimode transceiver may operate in two or more of the modes concurrently. In general, the multimode transceiver 10 may receive one or more of the following input source signals in accordance with some embodiments of the invention: a digital audio (called "DIN"), which is received through the digital audio interface 16; an incoming RF signal that is received from an external receive antenna 80; a digital audio band signal that is received from the digital audio interface 16; and left channel (called "LIN") and right channel (called "RIN") analog stereo channel signals that are received at input terminals 40 and 42, respectively.

Depending on the particular configuration of the multimode transceiver 10, the transceiver 10 is capable of mixing two or more of its input source signals together to generate one or more of the following output signals: an outgoing FM transmission signal to drive an external transmit antenna 60; left channel (called "LOUT") and right channel (called "ROUT") analog stereo signals that appear at output terminals 52 and 50, respectively; and a digital output signal (called "DOUT") that is routed through the digital audio interface 16. In accordance with some embodiments of the invention, the multimode transceiver 10 may also provide a low impedance RF transmission output signal (called "TXB") at an output terminal 64 for purposes of driving a low impedance load.

As described herein, the multimode transceiver 10 may reuse some of its hardware components for purposes of reducing the complexity and size of the transceiver 10, as well as reducing the overall time that may be consumed designing the transceiver 10. For example, in accordance with some embodiments of the invention, a DSP 20 of the multimode transceiver 10 performs both digital FM modulation (for the FM transmit mode) and digital AM and FM demodulation (for the receive mode) for the transceiver 10. As another example of the hardware reuse, analog-to-digital converters (ADCs) 24 and 26 of the multimode transceiver 10 perform transformations between the analog and digital domains for both complex (when the transceiver 10 is in the FM receive mode) and real (when the transceiver 10 is in the transmit modes) signals. Additionally, the ADCs 24 and 26 may be used in the audio mode for purposes of digitizing the LIN and RIN stereo channel signals.

As another example of hardware reuse by the multimode transceiver 10, in accordance with some embodiments of the invention, digital-to-analog converters (DACs) 32 and 36 of the transceiver 10 convert digital audio band signals from the digital to the analog domain for both the receive and audio modes. The DACs 32 and 36 are also used during the FM transmit mode for purposes of converting intermediate frequency (IF) band signals from the digital to the analog domain.

Turning now to the overall topology of the multimode transceiver 10, the transceiver 10 includes a multiplexer 95 for purposes of routing the appropriate analog signals to the ADCs 24 and 26 for conversion. For example, the multiplexer 95 may select an incoming analog IF signal during the receive mode and select the LIN and RIN stereo channel signals during the FM transmit and audio modes. The digital signals that are provided by the ADCs 24 and 26 are routed to the DSP 20.

For the receive modes, the multimode transceiver 10 includes analog mixers 90 that are coupled to a tunable local oscillator 92, the frequency of which selects the desired radio channel to which the transceiver 10 is tuned. In response to the incoming RF signal, the mixers 90 produce corresponding analog IF, quadrature signals that pass through programmable gain amplifiers (PGAs) 94 before being routed to the ADCs 24 and 26. Thus, the ADCs 24 and 26 convert the analog IF quadrature signals from the PGAs 94 into digital signals, which are provided to the DSP 20. The DSP 20 demodulates the received complex signal to provide corresponding digital left and right channel stereo signals at its output terminals; and these digital stereo signals are converted into the analog counterparts by the DACs 32 and 36, respectively. As described further below, mixing may then be performed by mixers, or analog adders 54, which provide the ROUT and LOUT stereo signals at the output terminals 50 and 52, respectively. It is noted that the digital demodulated stereo signals may also be routed from the DSP 20 to the digital audio interface 16 to produce the DOUT digital signal.

In the FM transmit mode of the multimode transceiver 10, the content to be transmitted over the FM channel (selected by the frequency of the local oscillator 92, for example) may originate with the DIN digital data signal, the LIN and RIN stereo channel signals or a combination of these signals. Thus, depending on whether the analog signals communicate some or all of the transmitted content, the multimode transceiver 10 may use the ADCs 24 and 26. The DSP 20 performs FM modulation on the content to be transmitted over the FM channel to produce digital orthogonal FM signals, which are provided to the DACs 32 and 36 to produce corresponding analog orthogonal FM signals, which are in the IF range. Analog mixers 68 (which mix the analog orthogonal FM signals with a frequency that is selected by the local oscillator 92) of the multimode transceiver 10 frequency translate and combine the signals to produce an RF FM signal that is provided to the transmit antenna 60. In the audio mode of the multimode transceiver 10, the DSP 20 may be used to perform digital mixing. Analog mixing in the audio mode may be performed using the adder 54.

Among the other features of the multimode transceiver 10, in accordance with some embodiments of the invention, the transceiver 10 includes a control interface 38 for purposes of receiving various signals 39 that control the mode (FM transmit, AM or FM receive or audio) in which the transceiver 10 is operating, as well as the specific submode configuration for the mode, as further described below. For example, different firmware present in the DSP 20 may be executed based on the selected mode of operation. In accordance with some embodiments of the invention, the multimode FM transceiver 10 may also include a microcontroller unit (MCU) 98 that coordinates the general operations of the transceiver 10, such as configuring the ADCs 24 and 26 and DACs 32 and 36, configuring data flow through the multiplexer 95, or the like.

Figure 2:
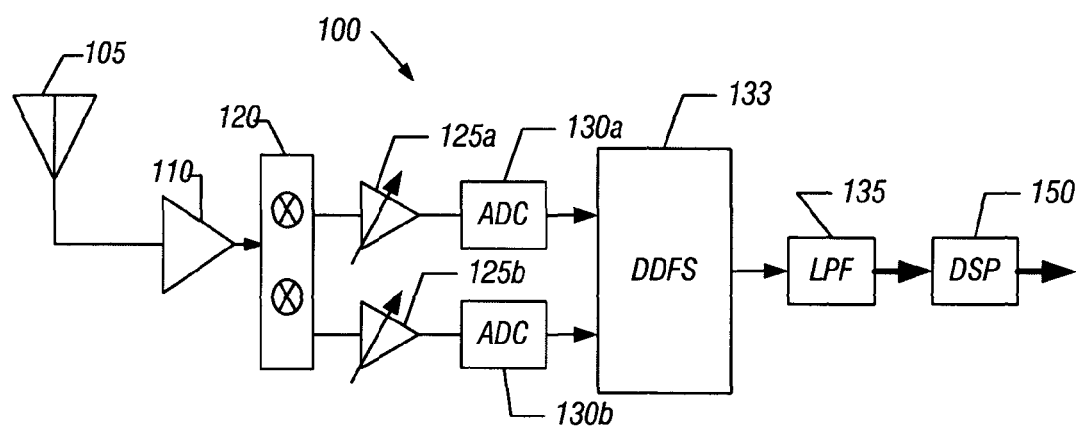
FIG. 2 is a block diagram of an AM receiver in accordance with an embodiment of the present invention.

Referring now to FIG. 2, shown is a block diagram of an AM receiver in accordance with an embodiment of the present invention. In some embodiments, receiver 100 of FIG. 2 may be implemented via the various components of transceiver 10 described above, although the scope of the present invention is not limited in this aspect. As shown in FIG. 2, receiver 100 is used to receive and process an incoming AM signal. Receiver 100 includes an antenna 105 to receive an RF signal and provide it to a low noise amplifier (LNA) 110. The output of LNA 110 is provided to a complex mixer 120 which generates I and Q signals therefrom. While not shown in the embodiment of FIG. 2, in various implementations mixer 120 may be controlled by an output of a voltage controlled oscillator (VCO) or a numerically controlled oscillator (NCO). The complex outputs of mixer 120 may be amplified in PGAs 125a and 125b. PGAs 125a and 125b may operate based on AGC to output a signal of substantially steady gain, in some embodiments. Complex mixer 120 may mix the incoming RF signals down to a low intermediate frequency (IF) value. In various instances, incoming signals may be provided with positive gain (i.e., amplification) or negative gain (i.e., attenuation) in PGAs 125, based on various circumstances. The output of PGAs 125a and 125b may be provided to corresponding ADCs 130a and 130b. The outputs of ADCs 130a and 130b may be provided to a direct digital frequency synthesizer (DDFS) 133 that may generate a downmixed baseband complex signal, which may in turn be filtered via a low pass filter (LPF) 135.

As shown in FIG. 2, the filtered complex signal may then be provided to a DSP 150. DSP 150 may be used to perform various signal processing on the filtered complex signal. For example, DSP 150 may perform digital-based demodulation. For ease of illustration in this high level block diagram of FIG. 2, the output signal of DSP 150 may correspond to an AM demodulated signal. However, understand that DSP 150 may perform further signal processing based on the incoming signal. Such processing may include power analysis, adjacent channel analysis, further filtering, other control mechanisms and so forth. Furthermore, while not shown for ease of illustration in FIG. 2, circuitry within DSP 150 or a separate processor may be used to perform other control functions. Understand further that while shown in the high level block diagram of FIG. 2 as outputting an AM demodulated signal, in other modes of operation, DSP 150 (specifically, and generically receiver 100) may perform FM demodulation, among other signal processing operations.

Figure 3:
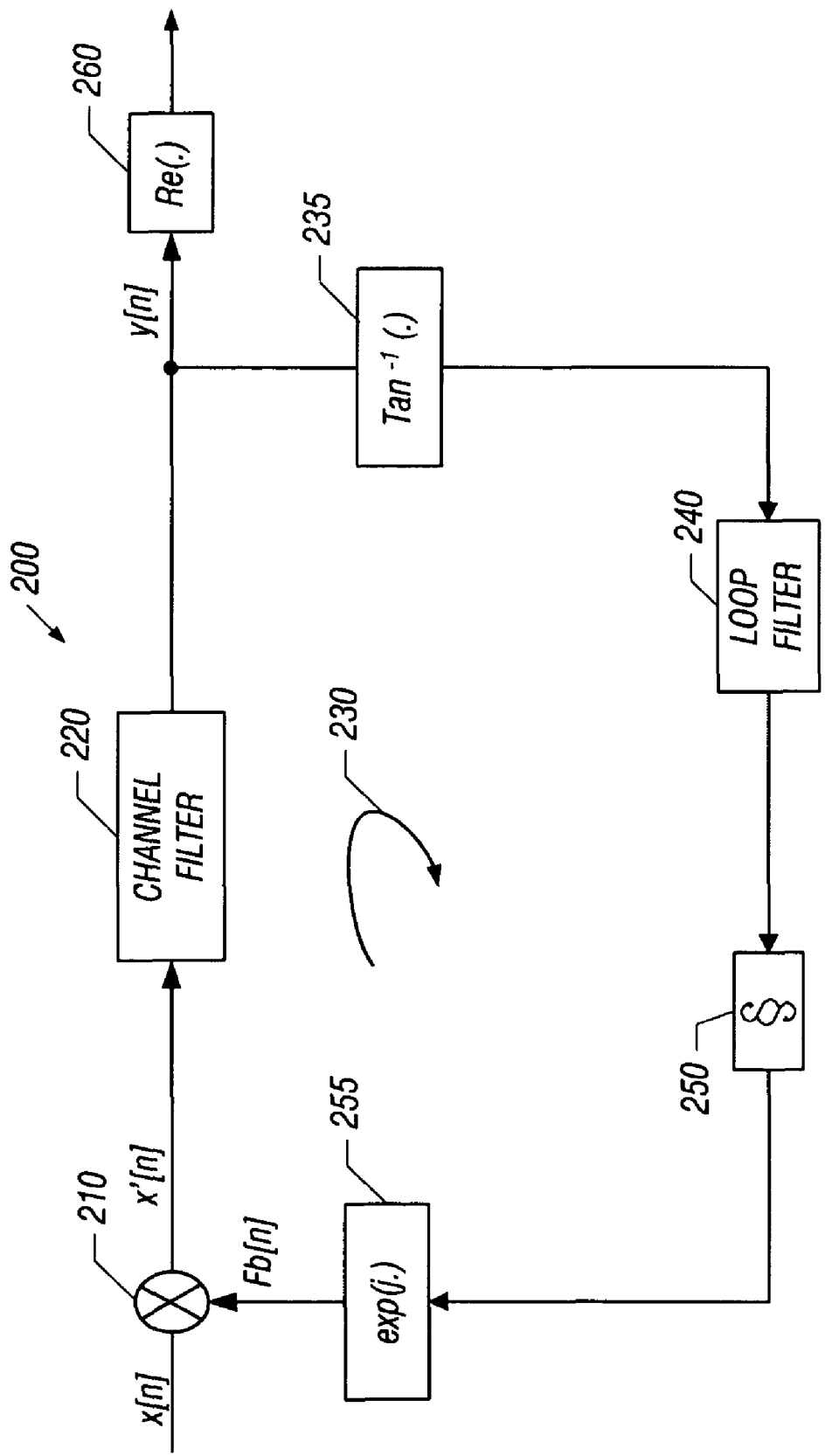
FIG. 3 is a block diagram of a combined channel filter and AFC loop in accordance with one embodiment of the present invention.

Referring now to FIG. 3, shown is a block diagram of a combined channel filter and AFC loop in accordance with one embodiment of the present invention. As shown in FIG. 3, a receiver 200 may include a combined channel filter/AFC loop 230. While the scope of the present invention is not limited in this regard, this loop may be present in a signal processing path after an incoming AM signal has been downmixed to baseband and digitized into digital signals, i.e., digital complex I and Q signals. Thus as shown in FIG. 3, an incoming signal, x[n], may be a digital complex signal having in-phase and quadrature portions and a modulation index greater than zero. These signals are input into a complex multiplier 210, where the incoming signal may be multiplied with a feedback signal, fb[n], from loop 230. This multiplied signal, x'[n], may then be provided to a channel filter 220. Note that multiplying the incoming signal by the feedback signal may remove a frequency offset of the signal such that the resulting signal x'[n] may be centered within channel filter 220. In various embodiments, channel filter 220 may be a real-valued bandpass filter that is centered at a carrier frequency of a desired channel, $\omega=0$. Note that in some implementations, channel filter 220 may have a programmable bandwidth based on analysis of the signal spectrum. That is, depending on the location of adjacent channels and their relative power, the bandwidth of channel filter 220 may be increased or decreased. In some implementations, a predetermined number of filter coefficients may be present in a storage to enable various filter bandwidths. As an example only, in one embodiment filter coefficients may be present for bandwidths between approximately 4 and 12 kHz.

Loop 230 may act to remove both phase and frequency offsets from x[n]. Accordingly, the phase of the output of channel filter 220, i.e., y[n], may be driven to zero. When frequency locking has been obtained via loop 230 the real portion of y[n] contains the desired signal in addition to any remaining undesired (e.g., adjacent) signals or noise. In contrast, the imaginary portion of y[n] contains only undesired signal information and/or noise. Accordingly, to recover the message information from the incoming signal the real portion of y[n] may be used. Thus, a splitter 260 may be present to filter the imaginary portion and provide only the real portion, e.g., to demodulation or other signal processing circuitry of receiver 200.

Referring still to FIG. 3, loop 230 may include a phase recovery block 235. Phase recovery block 235, which may correspond to a $\tan^{-1}$ function, may be used to recover phase information from the channel filtered signal y[n]. Thus, block 235 may determine a phase angle based on the in-phase and quadrature portions of the channel filtered signal. In one embodiment, a coordinate rotation digital computer (CORDIC) operation may be performed to obtain this phase information. As one example, a DSP may be programmed to execute the CORDIC operation, e.g., using a lookup table (LUT) present in the receiver. Alternately, a dedicated CORDIC processor or other coprocessor may be used to obtain the phase information. This phase information may then be provided to a loop filter 240, which may effectively perform low pass filtering of this phase information. Loop filter 240 may thus remove any remaining undesired signal information. The filtered signal may then be integrated in an integrator 250, the output of which may be applied to an exponential function block 255, which may perform an exponential function to obtain a complex value that may be passed as a feedback signal fb[n] to multiplier 210. In one implementation the same CORDIC processor, operating in reverse, may perform this exponential function. This feedback signal, fb[n], may thus remove both frequency and phase offsets from the incoming signal x[n]. While shown with this particular implementation in the embodiment of FIG. 3, understand the scope of the present invention is not limited in this regard.

Figure 4:
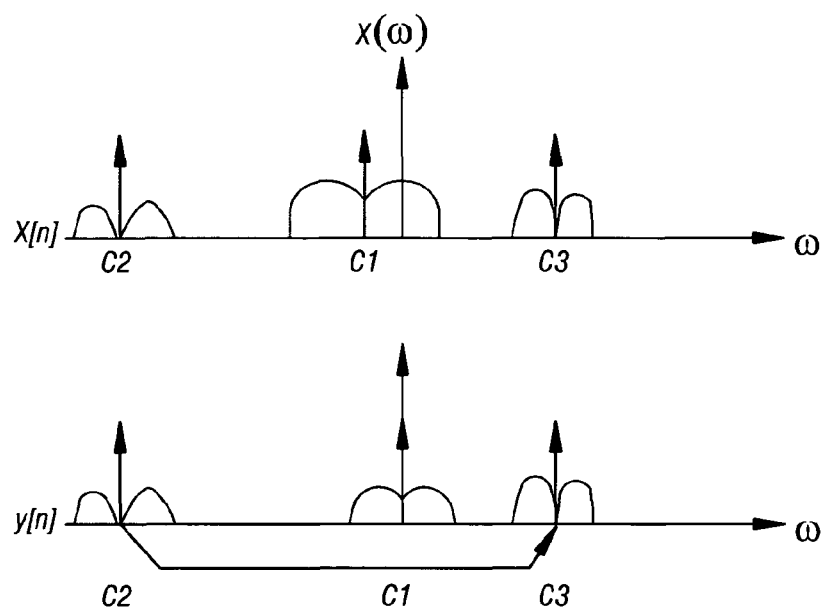
FIG. 4 is a block diagram of an input signal spectrum received by an AM receiver.

Note however that if a large adjacent channel signal is present, some undesired information may remain present throughout loop 230 which is included as part of the feedback signal to multiplier 210. Such large adjacent signal may disturb and distort the output of multiplier 210. Thus operation of loop 230 of FIG. 3 may lead to a signal spectrum as shown in FIG. 4. Specifically, FIG. 4 shows an input signal spectrum (in the frequency spectrum) in which a desired channel C1 is slightly offset from DC in the frequency domain as it is input into multiplier 210 (i.e., as x'[n]). Also shown are undesired adjacent channels C2 and C3 at either side of the desired channel C1. Because such channels may be relatively close to the desired channel, e.g., within approximately 10 kHz of the desired channel, filtering performed by channel filter 220 may still allow some of the undesired signal information of channels C2 and C3 to remain in its output y[n] as shown in FIG. 4. Specifically, at least the closer sideband portions of channels C2 and C3 may be present within a passband of channel filter 220. Such undesired signal information would pass through loop 230 and be fed back into multiplier 210, where it may cause distortion at the input of channel filter 220.

Figure 5:
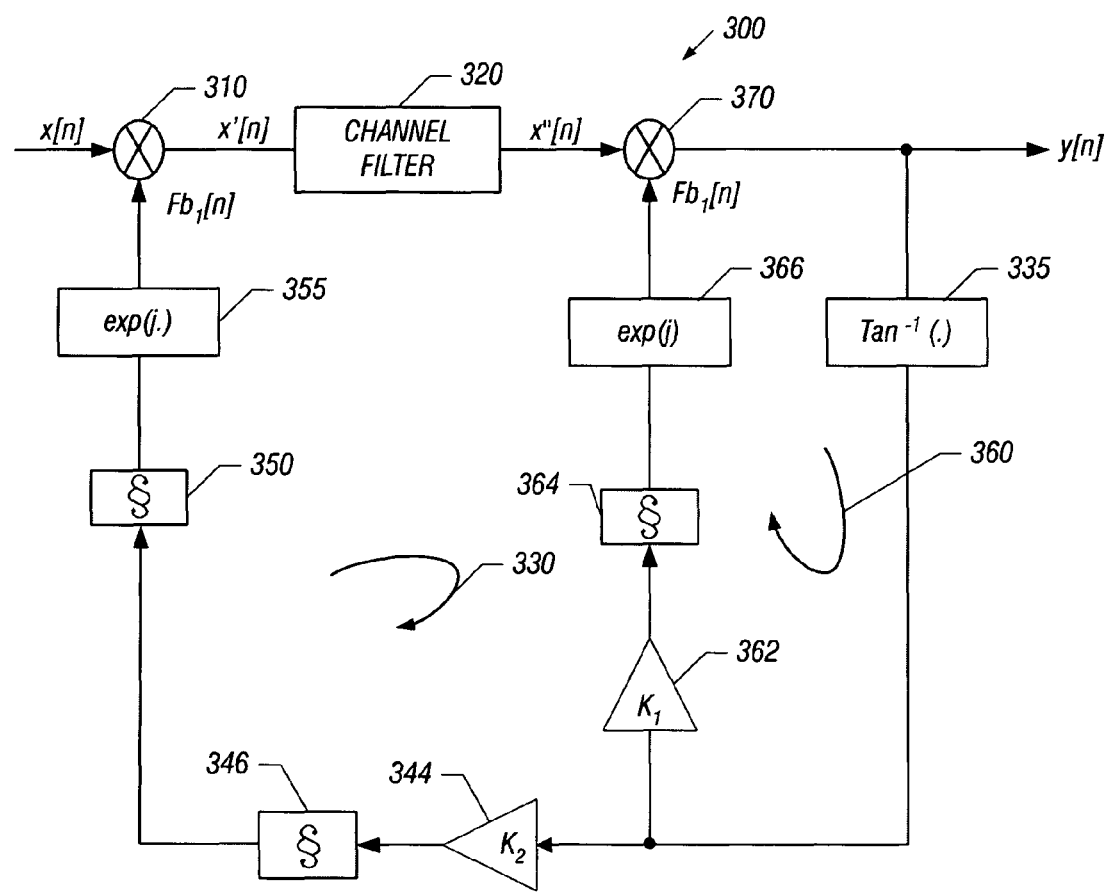
FIG. 5 is a block diagram of a dual feedback loop in accordance with an embodiment of the present invention.

Accordingly, to reduce such distortion while still allowing for frequency locking in accordance with an embodiment of the present invention, a dual feedback loop approach may be implemented. Referring now to FIG. 5, shown is a block diagram of a dual feedback loop in accordance with an embodiment of the present invention. As shown in FIG. 5, a receiver 300 may include a signal processing path that includes a multiplier 310, a channel filter 320, and a second multiplier 370. First multiplier 310 and channel filter 320 may operate similar to those discussed above with regard to FIG. 2. Note that in the embodiment of FIG. 5, there are two feedback paths, namely a first loop that takes the form of a feedback loop 330, as well as a second loop that takes the form of a signal filtering loop 360.

Referring still to FIG. 5, first loop 330 includes a phase recovery block 335 to obtain phase offset information. A gain block 344 having a gain of K2 is coupled to receive the phase output of phase recovery block 335. An integrator 346 is coupled to an output of gain block 344. Collectively, blocks 344 and 346 may correspond to a loop filter that is used to low pass filter the phase information. Integrator 346 may thus serve to capture a frequency offset $\omega_0$ which, once locked, represents the frequency offset of the incoming signal. This frequency offset is provided to another integrator 350 which in turn is coupled to an exponential generator block 355 to generate a complex exponential signal as a second feedback signal, $fb_2[n]$, that is provided to multiplier 310. Accordingly, first loop 330 acts to low pass filter the phase information and provide a frequency offset to complex multiplier 310. The low pass filtering of feedback loop 330 may be of a much narrower bandwidth than if signal filtering loop 360 was combined with it. In this way, undesired adjacent channels cannot distort desired signals since they are frequency convolved with the $fb_2(\omega)$ spectrum. In this way, $fb_2(\omega)$ may be more akin to that of a pure impulse, providing a frequency shift to DC for the desired signal channel. Thus, no distortion from the undesired channels can enter into the desired signal path.

As such, when x'[n] is channel filtered in channel filter 320 to obtain x"[n], the undesired signal information may be primarily removed. However, using only first loop 330, a remaining static phase offset of the incoming signal may still be present. Accordingly, second loop 360 may be used to remove this static phase offset information. Second loop 360 may also be coupled to receive the phase information from phase recovery block 335 that is provided to a gain block 362 which may be of a given delay and having a gain of K1. Gain block 362 in turn is coupled to an integrator 364, thus forming another loop filter. In the embodiment of FIG. 5, the value of gain block 362 (i.e., K1) may be much greater than that of the value of gain block 344 (i.e., K2) such that any signal remaining at the input of these loop filters influences the output more through second loop 360 than first loop 330 (i.e., through gain block 362 more than gain block 344) in a dynamic sense. Thus gain block 362 and integrator 364 essentially pass the undesired signal with a wider bandwidth than the low pass filter of feedback loop 330. This signal information is then converted into complex exponential form via exponential generator block 366. In turn, this phase offset information, $fb_1[n]$, may be provided to second multiplier 370 so that the resulting output of second multiplier 370, i.e., y[n], is virtually free of any remaining static phase offset. That is, because second loop 360 includes a gain term only (gain block 362), remaining undesired signals that are present at $fb_1[n]$ enables much less distortion than if second loop 360 were fed back prior to channel filter 320. Note that because first loop 330 removes any frequency offset from the incoming signal x[n], the benefit of having a real valued, centered channel filter operating on a complex DC centered signal may be realized.

Accordingly by including a channel filter within an AFC loop, performance may be improved both by reducing frequency response distortion of uncentered channel filtering, as well as avoiding signal distortion in the AFC loop due to out-of-band signals. Furthermore, by providing a dual feedback path, AFC performance may further be increased by reducing signal distortion due to undesired signals remaining at an output of the channel filter.

Figure 6:
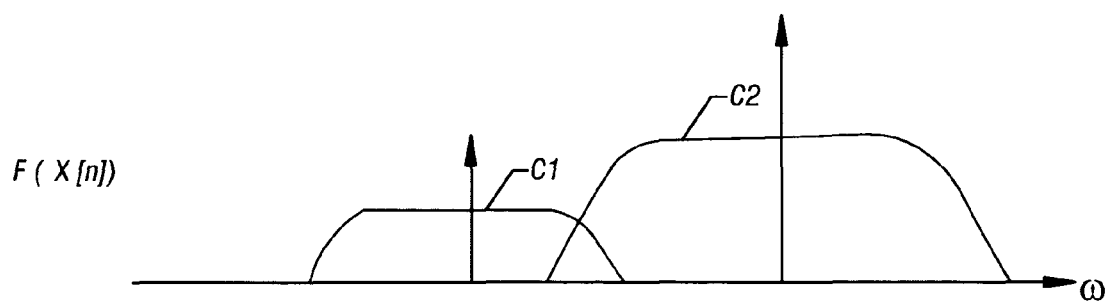
FIG. 6 is a frequency domain diagram of adjacent channels.

Depending on a given radio spectrum in which a receiver is operating, multiple channels may be present within a relatively close frequency range. For example, assume a desired channel of interest is present at a first carrier frequency $\omega_o$. It is possible for adjacent channels to be present, e.g., at approximately 9 or 10 kHz plus or minus $\omega_o$. If one or more of such adjacent channels have relatively large power with respect to the desired channel, it may bleed over into the desired channel. Referring now to FIG. 6, shown is a frequency domain diagram of two adjacent channels. As shown in FIG. 6, a desired channel C1 is of relatively low power, while an adjacent channel C2 may be of greater power. Note that adjacent channel C2 bleeds over into the upper sideband of desired channel C1. However, the bleed over is not symmetric and the lower sideband of desired channel C1 is uncorrupted (or at least less corrupted) by the power of adjacent channel C2. Because upper and lower sidebands contain redundant information, it may be possible to remove the corrupted sideband and pass the relatively uncorrupted sideband through for signal processing.

Figure 7:
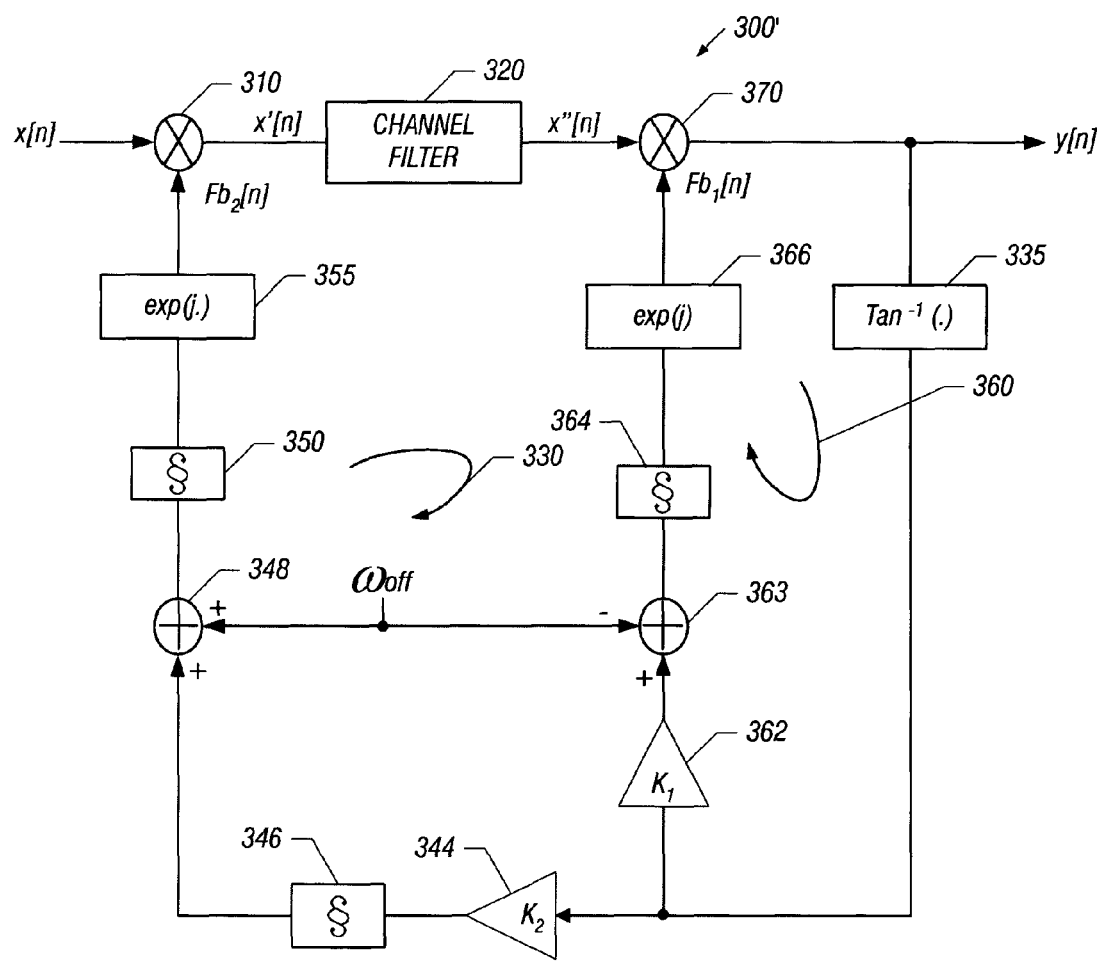
FIG. 7 is a block diagram of another receiver in accordance with an embodiment of the present invention.

Referring now to FIG. 7, shown is a block diagram of another receiver in accordance with an embodiment of the present invention. As shown in FIG. 7, receiver 300' may be similar to that of receiver 300' of FIG. 5. However, in the embodiment of FIG. 7 receiver 300' provides for offset frequency filtering. Specifically, an offset may be introduced into the dual feedback paths to enable channel filter 320 to operate on an incoming signal that has a corrupted sideband by offsetting the input by a predetermined frequency shift. Such shift may allow channel filter 320 to filter the relatively corruption-free sideband to recover the desired channel, while avoiding the corrupted sideband. Thus, non-symmetric channel filtering may be performed using minimal extra computation or hardware. Specifically, a predetermined constant value, i.e., $\omega_{off}$, may be used to produce a frequency shift in the first feedback path such that first feedback signal $fb_2[n]$ is frequency shifted in the desired direction so that the uncorrupted sideband may be centered at DC. In various embodiments, the passband of channel filter 320 may be controllably reduced to thus avoid the uncorrupted sideband. Accordingly, channel filter 320, which may be a symmetric channel filter may have a passband of appropriate width to pass only the centered sideband portion.

As shown in FIG. 7, $\omega_{off}$ may be provided to an adder 348 in which it is added to the incoming lowpass filtered phase offset information that is then provided to integrator 350 and exponential generator block 355 to generate the feedback signal $fb_2[n]$ with a frequency shift. To then remove this frequency shift after channel filtering, the same predetermined offset value $\omega_{off}$ may provided to an adder 363 where the value may be subtracted from the output of gain block 362. This summed value may then be integrated in integrator 364 and provided to exponential function generator block 366. Accordingly, the feedback signal provided to second multiplier 370, $fb_1[n]$, will cause a frequency shift in the opposite direction so that the desired channel, once frequency locked, will remain centered at y[n]. However, only the desired sideband information remains in this signal path. While the scope of the present invention is not limited in this regard, in some implementations the frequency offset, $\omega_{off}$, may be approximately 2.5 kHz. Thus, with a centered channel filter 320 with bandwidth of –2.5 kHz to 2.5 kHz, a 2.5 kHz shift will center the uncorrupted sideband in filter 320, with the corrupted sideband being filtered out.

Note that while certain implementations may provide such frequency offset capabilities, they may only be enabled when an adjacent channel with relatively large power is encountered. Thus, while not shown in FIG. 7, there may be a separate signal processing loop that analyzes power of both a desired channel and adjacent channels and, only if the adjacent channel(s) is of a given relative power with respect to the desired channel, will the frequency offset be performed. Accordingly, non-symmetric filtering of channels may be performed if a corrupted upper or lower sideband is determined to be present.

Figure 8:
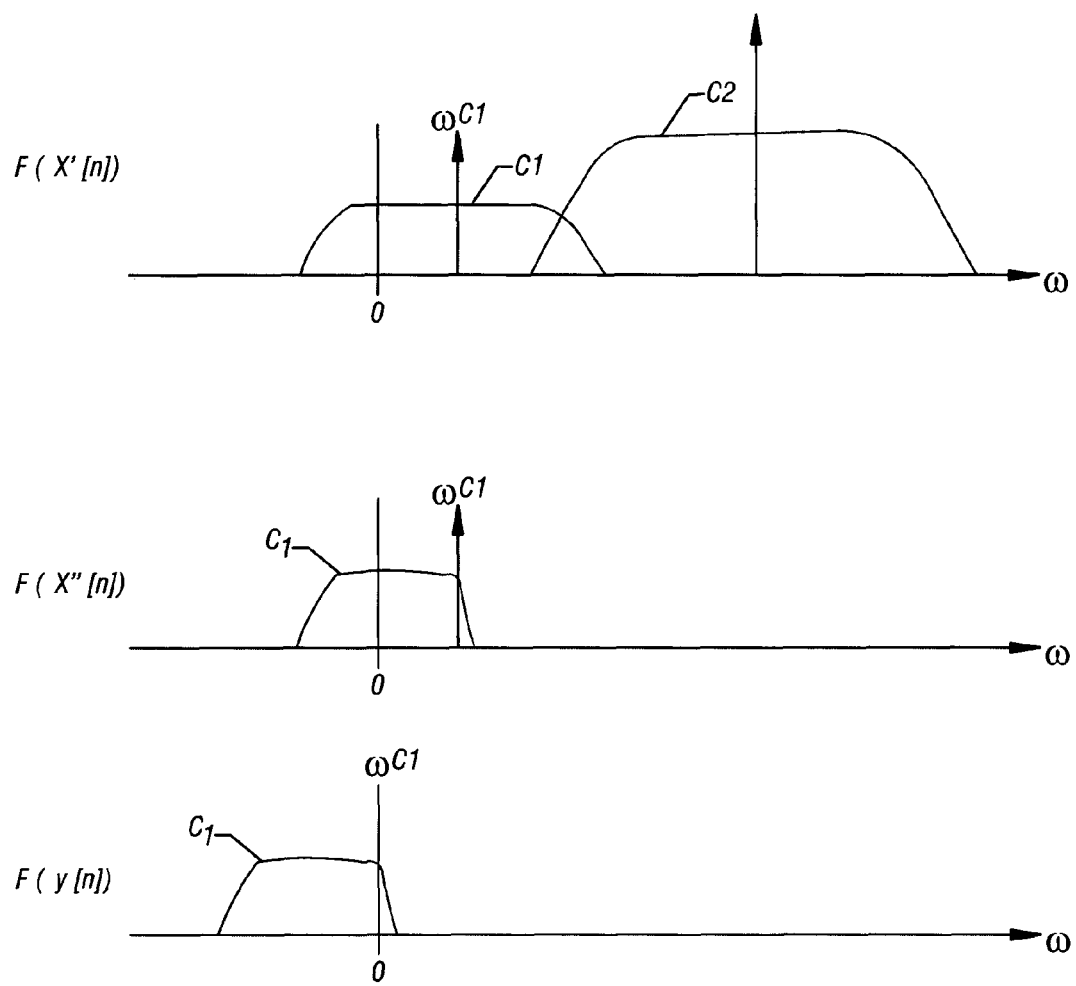
FIG. 8 is a frequency domain analysis of signals present at various portions of the signal processing chain of FIG. 7.

Referring now to FIG. 8, shown is a frequency domain analysis of the signals present at various portions of the signal processing chain of FIG. 7. Specifically, FIG. 8 shows the frequency domain present at the input of channel filter 320 (i.e., x'[n]), the output of channel filter 320 (i.e., x"[n]), and the output of second multiplier 370 (i.e., y[n]). As shown in FIG. 8, at the input of channel filter 320 the upper sideband of the desired signal channel suffers from bleed over from a relatively large adjacent channel C2. Accordingly, the use of the frequency offset into the first feedback path enables a frequency shift in the desired direction such that channel filter may be centered in the uncorrupted lower sideband. Also shown in FIG. 8, at the output of channel filter 320, only the desired channel remains with limited or no bleed over, as the channel filter operates non-symmetrically with its center frequency centered within the lower sideband. To enable proper demodulation of this recovered information, the equal and opposite frequency shift is input via second feedback path 360 into second multiplier 370, the output of which is shown in FIG. 8, in which the desired channel remains centered with the uncorrupted sideband remaining.

Figure 9:
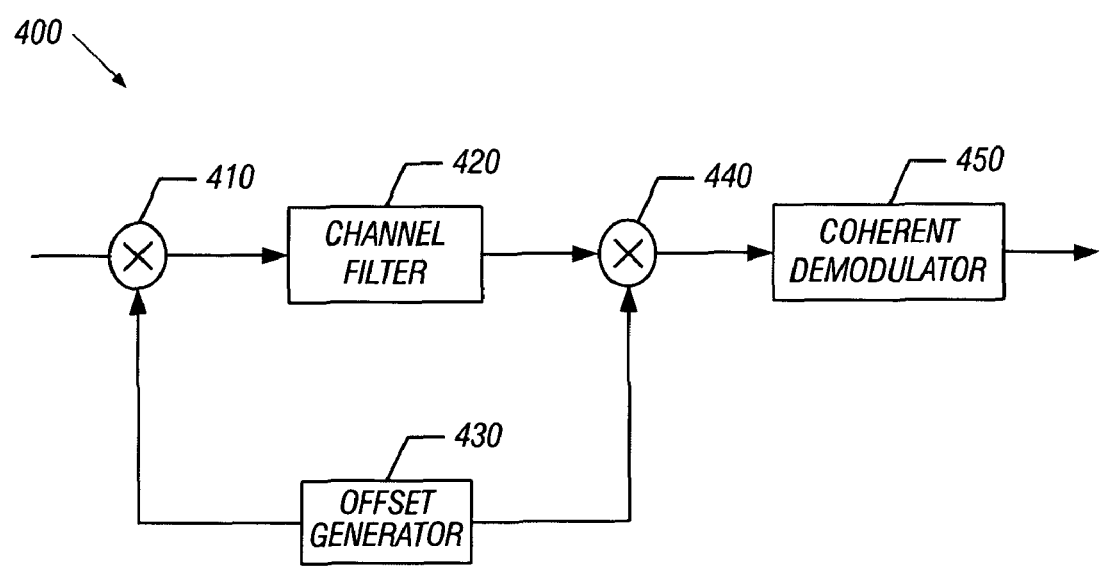
FIG. 9 is a block diagram of a portion of a receiver in accordance with another embodiment of the present invention.

While offset frequency filtering may be effected along with dual feedback loops in implementations such as that shown in FIG. 7, in other embodiments offset frequency filtering may be performed in different architectures. Referring now to FIG. 9, shown is a block diagram of a portion of a receiver in accordance with another embodiment of the present invention. As shown in FIG. 9, receiver 400 may be adapted to receive an incoming signal, e.g., a downconverted signal that may be at an IF or baseband value. A first multiplier 410, which may be a complex multiplier, is coupled to receive the incoming signal, along with a frequency offset generated by an offset generator 430. While not shown in FIG. 9 for ease of illustration, offset generator may include or be coupled to an integrator and an exponential generator to provide the frequency offset in complex exponential form. In various embodiments, offset generator 430 may provide a frequency offset if it determined that one or more adjacent channels to a selected channel is of a given the relative power. For example, if an adjacent channel has a greater relative power than the selected channel such that it is possible for the adjacent channel power to bleed over at least into the closest sideband of the selected channel, offset generator 430 may generate a frequency offset. While the scope of the present invention is not limited in this regard, in some implementations offset generator 430 may be implemented in a DSP or other programmable logic to analyze a frequency spectrum for adjacent channels and their relative powers with respect to a selected channel and generate a selected frequency offset. Based on the location of the adjacent channel with respect to the selected channel, the offset value may be generated with a positive or negative value.

In operation, first multiplier 410 may combine the incoming signal with the frequency offset. Specifically, first multiplier 410 may multiply the signals together to generate a combined signal that is provided to a channel filter 420 to perform channel filtering on the received signal. In some implementations offset generator 430 or other control circuitry may also cause an adjustment to the passband of channel filter 420 when a frequency offset is present. This programmable passband may thus be implemented with a smaller bandwidth to avoid passing undesired information in the corrupted sideband. The output of channel filter 420 is coupled to a second multiplier 440 which is further coupled to receive a frequency offset from offset generator 430. In some implementations, this offset value may be positive or negative and may be the opposite value provided from offset generator 430 to first multiplier 410. Second multiplier 440 may remove the offset value from the output of channel filter 420. In this way, second multiplier 440 may combine the channel filter output and the frequency offset to obtain a filtered signal at the selected channel frequency. This filtered signal may then be provided to a coherent demodulator 450, which may demodulate the filtered signal, e.g., by extracting a real portion of the signal, in implementations in which the signal is a complex baseband signal. While shown with this particular implementation in the embodiment of the FIG. 9, the scope of the present invention is not limited in this manner.

Figure 10:
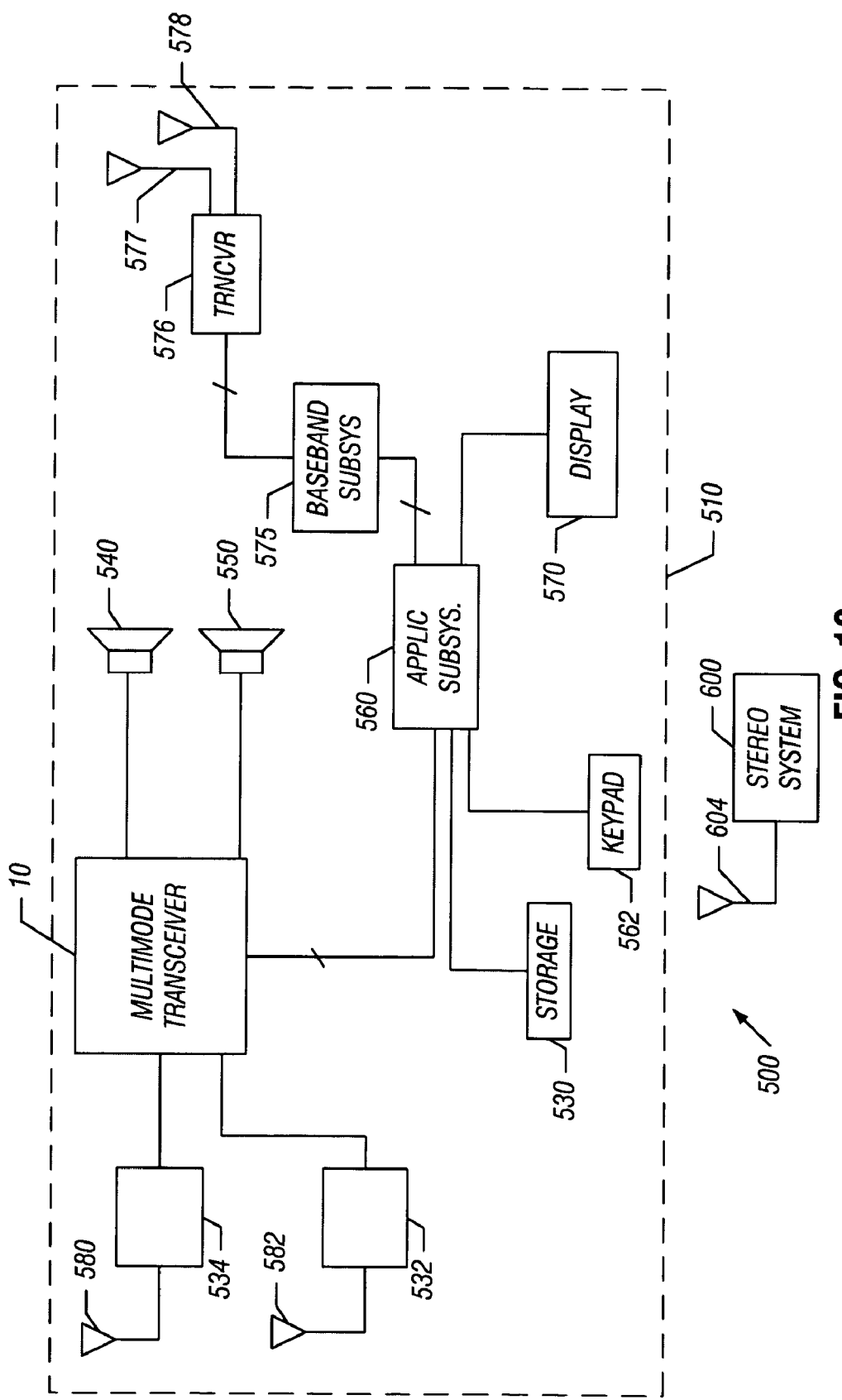
FIG. 10 is a block diagram of a system in accordance with one embodiment of the present invention.

Referring to FIG. 10, in accordance with some embodiments of the invention, the multimode transceiver 10 may be part of a multimedia portable wireless device 510, which, in turn, is part of a wireless system 500. As examples, the wireless device 510 may be a dedicated MP3 player, a cellular telephone or PDA with the capability of playing music downloads, part of a wireless link between a satellite antenna and a radio receiver, a terrestrial radio receiver, etc.

Among its other various functions, the wireless device 510 may store digital content on a storage 530, which may be a flash memory or hard disk drive, as a few examples. The wireless device 510 generally includes an application subsystem 560 that may, for example, receive input from a keypad 562 of the wireless device 510 and display information on a display 570. Furthermore, the application subsystem 560 may generally control the retrieval and storage of content from the storage 530 and the communication of, e.g., audio with the multimode transceiver 10. As shown, the multimode transceiver 10 may be directly connected to speakers 540 and 550 for output of audio data. As depicted in FIG. 10, the multimode transceiver 10 may be coupled by a matching network 534 to a receiver antenna 580 and may be coupled by a matching network 532 to the transmit antenna 582.

Although the wireless device 510 may include the speakers 540 and 550, it may be desirable to play sounds that are generated by the wireless device 510 over a more sophisticated speaker system. Therefore, in accordance with some embodiments of the invention, the wireless device 510, via the multimode transceiver 10, may broadcast content to be played over an FM channel to the receiver of an adjacent stereo system 600 (as an example). As shown, the stereo system 600 includes an RF antenna 604 for purposes of receiving the transmitted content from the wireless device 510.

In accordance with some embodiments of the invention, the wireless device 510 may have the ability to communicate over a communications network, such as a cellular network. For these embodiments, the wireless device 510 may include a baseband subsystem 575 that is coupled to the application subsystem 560 for purposes of encoding and decoding baseband signals for this wireless network. Baseband subsystem 575 may be coupled to a transceiver 576 that is connected to corresponding transmit and receive antennas 577 and 578.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A radio receiver comprising:
   a signal path to receive and downconvert an incoming amplitude modulation (AM) signal to a baseband signal;
   a first feedback loop having an input coupled to an output node of the signal path and an output coupled to a first combiner of the signal path to remove a frequency offset from the baseband signal;
   a second feedback loop having an input coupled to the output node and an output coupled to a second combiner of the signal path, wherein the second combiner is downstream of the first combiner, the second feedback loop to remove a phase offset from the baseband signal; and
   a channel filter coupled between the first combiner and the second combiner.

2. The radio receiver of claim 1, wherein the channel filter has a passband programmably based on analysis of one or more adjacent channels to a selected channel.

3. The radio receiver of claim 1, further comprising a first adder in the first feedback loop and a second adder in the second feedback loop to insert equal and opposite frequency offsets into the first and second feedback loops.

4. The radio receiver of claim 3, further comprising a controller to provide a frequency offset value to the first and second adders if an adjacent channel has a predetermined relative power with respect to a selected channel, wherein the controller is to adjust the passband of the channel filter if the frequency offsets are inserted.

5. The radio receiver of claim 1, wherein the first feedback loop comprises:
   a phase recovery mechanism;
   a loop filter coupled to an output of the phase recovery mechanism;
   an integrator coupled to an output of the loop filter; and
   an exponential generator coupled to an output of the integrator, wherein an output of the exponential generator is coupled to an input of the first combiner.

6. The radio receiver of claim 5, wherein the second feedback loop comprises:
   a second loop filter coupled to the output of the phase recovery mechanism; and
   a second exponential generator coupled to an output of the second loop filter, wherein an output of the second exponential generator is coupled to an input of the second combiner.

7. A system comprising:
   a digitizer to receive a downconverted amplitude modulation (AM) signal;
   a first combiner to receive an output of the digitizer to combine the digitized output signal and a frequency offset value in a first direction, the frequency offset value in the first direction obtained from a first feedback path;
   a channel filter to filter an output of the first combiner to pass a selected channel signal;
   a second combiner coupled to an output of the channel filter to combine the selected channel signal and the frequency offset value in a second direction opposite to the first direction, the frequency offset value in the second direction obtained from a second feedback path;
   a demodulator to demodulate an output of the second combiner; and
   an output device to output the demodulated signal.

8. The system of claim 7, further comprising an offset frequency generator to generate the frequency offset value.

9. The system of claim 8, wherein the offset frequency generator is to generate the frequency offset value if an adjacent channel to the selected channel has a relative power level greater than a predetermined threshold.

10. A radio receiver comprising:
    a signal path to receive and downconvert an incoming radio frequency (RF) signal to a baseband signal;
    a channel filter coupled between a first combiner and a second combiner of the signal path;
    a first feedback loop coupled between an output node of the signal path and the first combiner to remove a frequency offset from the baseband signal;
    a second feedback loop coupled between the output node and the second combiner to remove a phase offset from the baseband signal; and
    a first adder in the first feedback loop and a second adder in the second feedback loop to insert equal and opposite frequency offsets into the first and second feedback loops.

11. The radio receiver of claim 10, wherein the channel filter has a passband programmably based on analysis of one or more adjacent channels to a selected channel.

12. The radio receiver of claim 10, wherein the first feedback loop comprises:
    a phase recovery mechanism;
    a loop filter coupled to an output of the phase recovery mechanism;
    an integrator coupled to an output of the loop filter; and
    an exponential generator coupled to an output of the integrator, wherein an output of the exponential generator is coupled to an input of the first combiner.

13. The radio receiver of claim 12, wherein the second feedback loop comprises:
  a second loop filter coupled to the output of the phase recovery mechanism; and
  a second exponential generator coupled to an output of the second loop filter, wherein an output of the second exponential generator is coupled to an input of the second combiner.

14. The radio receiver of claim 10, further comprising a controller to provide a frequency offset value to the first and second adders if an adjacent channel has a predetermined relative power with respect to a selected channel, wherein the controller is to adjust the passband of the channel filter if the frequency offsets are inserted.

* * * * *